US00RE41667E

(19) United States
(12) Reissued Patent
Antoni et al.

(10) Patent Number: US RE41,667 E
(45) Date of Reissued Patent: Sep. 14, 2010

(54) ILLUMINATION SYSTEM PARTICULARLY FOR MICROLITHOGRAPHY

(75) Inventors: Martin Antoni, Aalen (DE); Wolfgang Singer, Aalen (DE); Johannes Wangler, Königsbronn (DE)

(73) Assignee: Carl Zeiss SMT AG, Oberkochen (DE)

(21) Appl. No.: 11/981,033

(22) PCT Filed: Sep. 28, 2001

(86) PCT No.: PCT/EP01/11224

§ 371 (c)(1),
(2), (4) Date: Jul. 30, 2003

(87) PCT Pub. No.: WO02/27405

PCT Pub. Date: Apr. 4, 2002

Related U.S. Patent Documents

Reissue of:

(64) Patent No.: 6,858,853
Issued: Feb. 22, 2005
Appl. No.: 10/381,624
Filed: Jul. 30, 2003

U.S. Applications:

(63) Continuation-in-part of application No. 09/679,718, filed on Sep. 29, 2000, now Pat. No. 6,438,199, which is a continuation-in-part of application No. 09/305,017, filed on May 4, 1999, now Pat. No. 6,198,793.

(30) Foreign Application Priority Data

| | | |
|---|---|---|
| May 5, 1998 | (DE) | 198 19 898 |
| Feb. 2, 1999 | (DE) | 199 03 807 |
| Feb. 8, 1999 | (DE) | 299 02 108 U |
| Jul. 28, 2000 | (EP) | PCT/EP00/07258 |
| Jan. 5, 2001 | (DE) | 201 00 123 U |
| Jan. 8, 2001 | (DE) | 101 00 265 |

(51) Int. Cl.

| | |
|---|---|
| ***G03F 7/20*** | (2006.01) |
| ***G21K 5/04*** | (2006.01) |
| ***G21K 1/06*** | (2006.01) |

(52) U.S. Cl. ..... 250/492.2; 250/492.1; 378/34; 359/351; 359/624; 359/626; 359/858; 355/67

(58) Field of Classification Search ..... 250/492.2, 250/492.1, 505.1; 378/34, 145, 146, 147; 359/351, 624, 626, 858; 355/67

See application file for complete search history.

(56) References Cited

U.S. PATENT DOCUMENTS 655,555 A * 8/1900 Jackson ..... 54/83.2

(Continued)

FOREIGN PATENT DOCUMENTS

DE 19903807 A1 * 11/1999

(Continued)

OTHER PUBLICATIONS

Murphy et al., "Synchrotron Radiation Sources and Condensers for Projection X–Ray Lithography", Applied Optics, vol. 32, No. 34, pp. 6920–6929 (Dec. 1, 1993).*

(Continued)

*Primary Examiner*—Jack I Berman
(74) *Attorney, Agent, or Firm*—Ohlandt, Greeley, Ruggiero & Perle, L.L.P.

(57) ABSTRACT

There is provided an illumination system for microlithography with wavelengths≦193 nm that includes a primary light source, a first optical component, a second optical component, an image plane, and an exit pupil. The first optical component transforms the primary light source into a plurality of secondary light sources that are imaged by the second optical component in the exit pupil. The first optical element and the second optical element are reflective. The first optical component includes a first optical element having a plurality of first raster elements that are imaged into the image plane, producing a plurality of images being superimposed, at least partially, on a field in the image plane. The first optical component includes a collector unit and a second optical element having a plurality of second raster elements. The illumination system also includes a first optical axis between the collector unit and the first optical element, a second optical axis between the first optical element and the second optical element, and a third optical axis between the second optical element and the second optical component. A directional vector of the first optical axis and a directional vector of the second optical axis define a plane and wherein the first and second optical elements are tilted to cause a crossing of the projection of the third optical axis in to the plane and the first optical axis.

16 Claims, 3 Drawing Sheets

U.S. PATENT DOCUMENTS 4,195,913 A * 4/1980 Dourte et al. ..... 359/853
4,294,538 A * 10/1981 Ban ..... 355/51
4,389,115 A * 6/1983 Richter ..... 359/641
4,651,012 A * 3/1987 Clark et al. ..... 250/505.1
4,655,555 A * 4/1987 Machler et al. ..... 359/365
4,740,276 A * 4/1988 Marmo et al. ..... 205/71
5,148,442 A * 9/1992 O'Neil et al. ..... 372/71
5,222,112 A * 6/1993 Terasawa et al. ..... 378/34
5,339,346 A * 8/1994 White ..... 378/34
5,353,322 A * 10/1994 Bruning et al. ..... 378/34
5,361,292 A * 11/1994 Sweatt ..... 378/34
5,402,267 A * 3/1995 Furter et al. ..... 359/727
5,439,781 A * 8/1995 MacDowell et al. ..... 430/311
5,440,423 A * 8/1995 Ogura ..... 359/365
5,459,547 A * 10/1995 Shiozawa ..... 355/67
5,512,759 A * 4/1996 Sweatt ..... 250/492.1
5,581,605 A * 12/1996 Murakami et al. ..... 378/84
5,647,664 A * 7/1997 Hanecka ..... 362/308
5,669,708 A * 9/1997 Mashima et al. ..... 362/341
5,677,939 A * 10/1997 Oshino ..... 378/341
5,737,137 A * 4/1998 Cohen et al. ..... 359/859
5,755,503 A * 5/1998 Chen et al. ..... 353/38
5,846,678 A * 12/1998 Nishigori et al. ..... 430/30
5,896,438 A * 4/1999 Miyake et al. ..... 378/34
5,963,305 A * 10/1999 Mizouchi ..... 355/67
5,993,010 A * 11/1999 Ohzawa et al. ..... 353/99
5,995,582 A * 11/1999 Terashima et al. ..... 378/34
6,081,319 A * 6/2000 Ozawa et al. ..... 355/67
6,198,793 B1 * 3/2001 Schultz et al. ..... 378/34
6,208,707 B1 * 3/2001 Oshino ..... 378/34
6,339,467 B1 * 1/2002 Sato ..... 355/77
6,400,794 B1 * 6/2002 Schultz et al. ..... 378/34
6,438,199 B1 * 8/2002 Schultz et al. ..... 378/34
6,507,440 B1 * 1/2003 Schultz ..... 359/626
6,583,937 B1 * 6/2003 Wangler et al. ..... 359/624
6,594,334 B1 * 7/2003 Ota ..... 378/34

FOREIGN PATENT DOCUMENTS

DE 29902108 U1 * 12/1999
EP 66295 A * 12/1982
EP 359018 A * 3/1990
EP 939341 A2 * 9/1999
EP 955641 A1 * 11/1999
EP 1026547 A2 * 8/2000

OTHER PUBLICATIONS

"Handbook on Synchrotron Radiation", Ernst–Echard Koch ed., pp. 140–145, 1098–1111 (1983).*

* cited by examiner

ILLUMINATION SYSTEM PARTICULARLY FOR MICROLITHOGRAPHY

Matter enclosed in heavy brackets [ ] appears in the original patent but forms no part of this reissue specification; matter printed in italics indicates the additions made by reissue.

[CROSS-REFERENCE TO RELATED APPLICATIONS

The present application is (a) a U.S. national stage entry of International Application No. PCT/EP01/11224, and (b) a continuation-in part of U.S. patent application Ser. No. 10/201,652. The PCT/EP01/11224 application was filed Sep. 28, 2001, and claims priority of(a) U.S. patent application Ser. No. 09/679,718, (b) German Patent Application No. DE 201 00 123.3, filed Jan. 5, 2001, and (c) German Patent Application No. DE 101 00 265.3, filed Jan. 8, 2001. Ser. No. 10/201,652 application was filed Jul. 22, 2002, and is (a) a continuation-in part of U.S. patent application Ser. No. 10/150,650, and (b) a continuation-in part of the Ser. No. 09/679,718 application. The Ser. No. 10/150,650 application was filed May 17, 2002, and is a continuation-in-part of the Ser. No. 09/679,718 application. The Ser. No. 09/679,718 application was filed Sep. 29, 2000, issued as U.S. Pat. No. 6,438,199, and is a continuation-in part of U.S. patent application Ser. No. 09/305,017. The Ser. No. 09/305,017 application was filed May 4, 1999, and issued as U.S. Pat. No. 6,198,793. The present application is also claiming priority of (a) International Application No. PCT/EP00/07258, filed Jul. 28, 2000, (b) German Patent Application No. 299 02 108, filed Feb. 8, 1999, (c) German Patent Application No. 199 03 807, filed Feb. 2, 1999, and (d) German Patent Application No. 198 19 898, filed on May 5, 1998.]

The invention concerns an illumination system for wavelengths≦193 nm as well as a projection exposure apparatus with such an illumination system.

In order to be able to further reduce the structural widths of electronic components, particularly in the submicron range, it is necessary to reduce the wavelengths of the light utilized for microlithography. Lithography with very deep UV radiation, so called VUV (Very deep UV) lithography or with soft x-ray radiation, so-called EUV (extreme UV) lithography, is conceivable at wavelengths smaller than 193 nm, for example.

An illumination system for a lithographic device, which uses EUV radiation, has been made known from U.S. Pat. No. 5,339,346. For uniform illumination in the reticle plane and filling of the pupil, U.S. Pat. No. 5,339,346 proposes a condenser, which is constructed as a collector lens and comprises at least 4 pairs of mirror facets, which are arranged symmetrically. A plasma light source is used as the light source.

In U.S. Pat. No. 5,737,137, an illumination system with a plasma light source comprising a condenser mirror is shown, in which an illumination of a mask or a reticle to be illuminated is achieved by means of spherical mirrors.

U.S. Pat. No. 5,361,292 shows an illumination system, in which a plasma light source is provided, and the point plasma light source is imaged in an annular illuminated surface by means of a condenser, which has five aspherical mirrors arranged off-center.

From U.S. Pat. No. 5,581,605, an illumination system has been made known, in which a photon beam is split into a multiple number of secondary light sources by means of a plate with concave raster elements. In this way, a homogeneous or uniform illumination is achieved in the reticle plane. The imaging of the reticle on the wafer to be exposed is produced by means of a conventional reduction optics The contents of the above-mentioned patents are incorporated by reference.

EP-A-0 939 341 shows an illumination system and exposure apparatus for illuminating a surface over an illumination field having an arcuate shape with X-ray wave length light. The illumination system comprises first and second optical integrators each with a plurality of reflecting elements. The first and second optical integrators being opposingly arranged such that a plurality of light source images are formed at the plurality of reflecting elements of the second optical integrator. To form an arcuate shaped illumination field in the field plane according to EP-A-0 939 341 the reflecting elements of the first optical integrator have an arcuate shape similar to the arcuate illumination field. Such reflecting elements are complicate to manufacture.

EP-A-1 026 547 also shows an illumination system with two optical integrators. Similar to the system of EP-A-0 939 341 the reflecting elements of the first optical integrator have an arcuate shape for forming an arcuate shaped illumination field in the field plane.

In EP-A-0 955 641 a system with two optical integrators is shown. Each of said optical integrators comprises a plurality of raster-elements. The raster elements of the first optical integrator are of rectangular shape. The arc-shaped field in the field plane is formed by at least one grazing incidence field mirror. Such systems are easier to manufacture than systems according to EP-A-0 939 341 or EP-A-1 026 547. The content of the above mentioned patent-application incorporated by reference. All above mentioned illumination systems have the disadvantage that the track-length, of the illumination system is large.

It is therefore an object of the invention to overcome the disadvantages of the illumination systems according to the state of the art, to provide an illumination system for microlithography that fulfills the requirements for advanced lithography with wavelength less or equal to 193 nm and which is of very compact size.

The object of the invention is solved by an illumination system with the features of claim 1 and by an projection exposure apparatus according to claim 16.

The system illuminates a structured reticle arranged in the image plane of the illumination system, which will be imaged by a projection objective onto a light sensitive substrate. In scanner-type lithography systems the reticle is illuminated with an arc-shaped field, wherein a pregiven uniformity of the scanning energy distribution inside the field is required, for example better than±5%. The scanning energy is defined as the line integral over the light intensity in the scanning direction. A further requirement is the illumination of the exit pupil of the illumination system, which is located at the entrance pupil of the projection objective. A nearly field-independent illumination of the exit pupil is required.

Typical light sources for wavelengths between 100 nm and 200 nm are excimer lasers, for example an ArF-Laser for 193 nm, an $F_2$-Laser for 157 nm, an $Ar_2$-Laser for 126 nm and an NeF-Laser for 109 nm. For systems in this wavelength region refractive components of $SiO_2$, $CaF_2$, $BaF_2$ or other crystallites are used. Since the transmission of the optical materials deteriorates with decreasing wavelength, the illumination systems are designed with a combination of refractive and reflective components. For wavelengths in the EUV wavelength region, between 10 nm and 20 nm, the projection exposure apparatus is designed as all-reflective. A typical EUV light source is a Laser-Produced-Plasma-source, a Pinch-Plasma-Source, a Wiggler-Source or an Undulator-Source.

The light of this primary light source is directed to a first optical element, wherein the first optical element is part of a first optical component. Preferably the first optical component comprises a collector unit, which collects the light from the primary light source and directs the light to the first optical element. The first optical element is organized as a plurality of first raster elements and transforms, together with the collector unit, the primary light source into a plurality of secondary light sources. Each first raster element corresponds to one secondary light source and focuses an incoming ray bundle, defined by all rays intersecting the first raster element, to the corresponding secondary light source. The secondary light sources are arranged in a pupil plane of the illumination system or nearby this plane. A field lens forming a second optical component is arranged between the pupil plane and the image plane of the illumination system to image the secondary light sources into an exit pupil of the illumination system, which corresponds to the entrance pupil of a following projection objective. The images of the secondary light sources in the exit pupil of the illumination system are therefore called tertiary light sources.

The first raster elements are imaged into the image plane, wherein their images are at least partially superimposed on a field that must be illuminated. Therefore, they are known as field raster elements or field honeycombs. If the light source is a point-like source, the secondary light sources are also point-like. In this case the imaging of each of the field raster elements can be explained visually with the principle of a "camera obscura", with the small hole of the camera obscura at the position of each corresponding secondary light source, respectively.

To superimpose the images of the field raster elements in the image plane of the illumination system the incoming ray bundles are deflected by the field raster elements with first deflection angles, which are not equal for each of the field raster elements but at least different for two of the field raster elements. Therefore individual deflection angles for the field raster elements are designed.

For each field raster element a plane of incidence is defined by the incoming and deflected controid ray selected from the incoming ray bundle. Due to the individual deflection angles, at least two of the incidence planes are not parallel.

In advanced microlithography systems the light distribution in the entrance pupil of a projection objective must fulfill special requirements such as having an overall shape or uniformity. Since the secondary light sources are imaged into the exit pupil, their arrangement in the pupil plane of the illumination system determines the light distribution in the exit pupil. With the individual deflection angles of the field raster elements a predetermined arrangement of the secondary light sources can be achieved, independent of the directions of the incoming ray bundles.

For reflective field raster elements the deflection angles are generated by the tilt angles of the field raster elements. The tilt axes and the tilt angles are determined by the directions of the incoming ray bundles and the positions of the secondary light sources, to which the reflected ray bundles are directed.

For refractive field raster element the deflection angles are generated by lenslets, which have a prismatic optical power. The refractive field raster elements can be lenslets with an optical power having a prismatic contribution or they can be a combination of a single prism and a lenslet. The prismatic optical power is determined by the directions of the incoming ray bundles and the positions of the corresponding secondary light sources.

Given the individual deflection angles of the first raster elements, the beam path to the plate with the raster elements can be either convergent or divergent. The slope values of the field raster elements at the centers of the field raster elements has then to be similar to the slope values of a surface with negative power to reduce the convergence of the beam path, or with positive power to increase the divergence of the beam path. Finally the field raster elements deflect the incoming ray bundles to the corresponding secondary light sources having predetermined positions depending on the illumination mode of the exit pupil.

The field raster elements are preferably arranged in a two-dimensional array on a plate without overlapping. For reflective field raster elements the plate can be a planar plate or a curved plate. To minimize the light losses between adjacent field raster elements they are arranged only with intermediate spaces between them, which are necessary for the mountings of the field raster elements. Preferably, the field raster elements are arranged in a plurality of rows having at least one field raster element and being arranged among one another. In the rows the field raster elements are put together at the smaller side of the field raster elements. At least two of these rows are displaced relative to one another in the direction of the rows. In one embodiment each row is displaced relative to the adjacent row by a fraction of a length of the field raster elements to achieve a regular distribution of the centers of the field raster elements. The fraction is dependent on the side aspect ratio and is preferably equal to the square root of the length of one field raster element. In another embodiment the rows are displaced in such a way that the field raster elements are illuminated almost completely.

Preferably, only these field raster elements are imaged into the image plane, which is completely illuminated. This can be realized with a masking unit in front of the plate with the field raster elements, or with an arrangement of the field raster elements wherein 90% of the field raster elements are completely illuminated.

It is advantageous to insert a second optical element with second raster elements in the light path after the first optical element with first raster elements, wherein each first raster element corresponds to one of the second raster elements. Therefore, the deflection angles of the first raster elements are designed to deflect the ray bundles impinging on the first raster elements to the corresponding second raster elements.

The second raster elements are preferably arranged at the secondary light sources and are designed to image together with the field lens the first raster elements or field raster elements into the image plane of the illumination system, wherein the images of the field raster elements are at least partially superimposed. The second raster elements are called pupil raster elements or pupil honeycombs. To avoid damaging the second raster elements due to the high intensity at the secondary light sources, the second raster elements are preferably arranged defocused of the secondary light sources, but in a range from 0 mm to 10% of the distance between the first and second raster elements.

For extended secondary light sources the pupil raster elements preferably have a positive optical power to image the corresponding field raster elements, which are arranged optically conjugated to the image plane. The pupil raster elements are concave mirrors or lenslets with positive optical power.

The pupil raster elements deflect incoming ray bundles impinging on the pupil raster elements with second deflection angles in such a way that the images of the field raster elements in the image plane are at least partially superimposed. This is the case if a ray intersecting the field raster element and the corresponding pupil raster element in their centers intersects the image plane in the center of the illuminated field or nearby the center. Each pair of a field raster element and a corresponding pupil raster element forms a light channel.

The second deflection angles are not equal for each pupil raster element. They are preferably individually adapted to the directions of the incoming ray bundles and the requirement to superimpose the images of the field raster elements at least partially in the image plane.

With the tilt axis and the tilt angle for a reflective pupil raster element or with the prismatic optical power for a refractive pupil raster element the second deflection angle can be individually adapted.

For point-like secondary light sources the pupil raster elements only have to deflect the incoming ray bundles without focusing the rays. Therefore the pupil raster elements are preferably designed as tilted planar mirrors or prisms.

If both, the field raster elements and the pupil raster elements deflect incoming ray bundles in predetermined directions, the two-dimensional arrangement of the field raster elements can be made different from the two-dimensional arrangement of the pupil raster elements. Wherein the arrangement of the field raster elements is adapted to the illuminated area on the plate with the field raster elements, the arrangement of the pupil raster elements is determined by the kind of illumination mode required in the exit pupil of the illumination system. So the images of the secondary light sources can be arranged in a circle, but also in an annulus to get an annular illumination mode or in four decentered segments to get a Quadrupol illumination mode. The aperture in the image plane of the illumination system is approximately defined by the quotient of the half diameter of the exit pupil of the illumination system and the distance between the exit pupil and the image plane of the illumination system. Typical apertures in the image plane of the illumination system are in the range of 0.02 and 0.1. By deflecting the incoming ray bundles with the field and pupil raster elements a continuous light path can be achieved. It is also possible to assign each field raster element to any of the pupil raster elements. Therefore the light channels can be mixed to minimize the deflection angles or to redistribute the intensity distribution between the plate with the field raster elements and the plate with the pupil raster elements.

Imaging errors such as distortion introduced by the field lens can be compensated for with the pupil raster elements being arranged at or nearby the secondary light sources. Therefore the distances between the pupil raster elements are preferably irregular. The distortion due to tilted field mirrors for example is compensated for by increasing the distances between the pupil raster elements in a direction perpendicular to the tilt axis of the field mirrors. Also, the pupil raster elements are arranged on curved lines to compensate for the distortion due to a field mirror, which transforms the rectangular image field to a segment of an annulus by conical reflection. By tilting the field raster elements the secondary light sources can be positioned at or nearby the distorted grid of the corresponding pupil raster elements.

For reflective field and pupil raster elements the beam path has to be folded at the plate with the field raster elements and at the plate with the pupil raster elements to avoid vignetting. Typically, the folding axes of both plates are parallel. Another requirement for the design of the illumination system is to minimize the incidence angles on the reflective field and pupil raster elements. Therefore the folding angles have to be as small as possible. This can be achieved if the extent of the plate with the field raster elements is approximately equal to the extent of the plate with the pupil raster elements in a direction perpendicular to the direction of the folding axes, or if it differs less than±10%.

Since the secondary light sources are imaged into the exit pupil of the illumination system, their arrangement determines the illumination mode of the pupil illumination. Typically the overall shape of the illumination in the exit pupil is circular and the diameter of the illuminated region is in the order of 60%–80% of the diameter of the entrance pupil of the projection objective. The diameters of the exit pupil of the illumination system and the entrance pupil of the projection objective are in another embodiment preferably equal. In such a system the illumination mode can be changed in a wide range by inserting masking blades at the plane with the secondary light sources to get a conventional, Dipol or Quadrupol illumination of the exit pupil.

All-reflective projection objectives used in the EUV wavelength region have typically an object field being a segment of an annulus. Therefore the field in the image plane of the illumination system in which the images of the field raster elements are at least partially superimposed has preferably the same shape. The shape of the illuminated field can be generated by the optical design of the components or by masking blades which have to be added nearby the image plane or in a plane conjugated to the image plane.

The field raster elements are preferably rectangular. Rectangular field raster elements have the advantage that they can be arranged in rows being displaced against each other. Depending on the field to be illuminated they have a side aspect ratio in the range of 5:1 and 20:1. The length of the rectangular field raster elements is typically between 15 mm and 50 mm, the width is between 1 mm and 4 mm.

To illuminate an arc-shaped field in the image plane with rectangular field raster elements the field lens preferably comprises a first field mirror for transforming the rectangular images of the rectangular field raster elements to arc-shaped images. The arc length is typically in the range of 80 mm to 105 mm, the radial width in the range of 5 mm to 9 mm. The transformation of the rectangular images of the rectangular field raster elements can be done by conical reflection with the first field mirror being a grazing incidence mirror with negative optical power. In other words, the imaging of the field raster elements is distorted to get the arc-shaped images, wherein the radius of the arc is determined by the shape of the object field of the projection objective. The first field mirror is preferably arranged in front of the image plane of the illumination system, wherein there should be a free working distance. For a configuration with a reflective reticle the free working distance has to be adapted to the fact that the rays traveling from the reticle to the projection objective are not vignetted by the first field mirror.

The surface of the first field mirror is preferably an off-axis segment of a rotational symmetric reflective surface, which can be designed aspherical or spherical. The axis of symmetry of the supporting surface goes through the vertex of the surface. Therefore a segment around the vertex is called on-axis, wherein each segment of the surfaces which does not include the vertex is called off-axis. The supporting surface can be manufactured more easily due to the rotational symmetry. After producing the supporting surface the segment can be cut out with well-known techniques.

The surface of the first field mirror can also be designed as an on-axis segment of a toroidal reflective surface. Therefore the surface has to be processed locally, but has the advantage that the surrounding shape can be produced before surface treatment.

The incidence angles of the incoming rays with respect to the surface normals at the points of incidence of the incoming rays on the first field mirror are preferably greater than 70°, which results in a reflectivity of the first field mirror of more than 80%.

According to the invention a compact configuration of the illumination system could be achieved, if the directional vector of the first optical axis and the directional vector of the second optical axis define a plane and the first and second optical elements are tilted to cause a crossing of the projection of the third optical axis into the plane defined by the directional vectors and the first optical axis. The first optical axis is defined as the optical axis between the collector unit and the first optical element, the second optical axis is defined as the optical axis between the first and the second optical element and the third optical axis is defined between the second optical element and the field lens. In a special embodiment the beam path from the plate with the pupil raster elements to the field lens is crossing the beam path from the collector unit to the plate with field raster elements. This is only possible, if the first, second and third optical axis lie in the same plane and if field raster elements and the pupil raster elements are reflective ones and are arranged on plates being tilted to achieve the crossing of the two beam paths. The crossing of the beam paths has the advantage that the beam path after the plate with the pupil raster elements has an angle in the range of 35° to 55° with respect to the beam in front of the plate with the field raster elements. This was achieved with only two normal incidence reflections.

The field lens comprises preferably a second field mirror with positive optical power. The first and second field mirror together image the secondary light sources or the pupil plane respectively into the exit pupil of the illumination system, which is defined by the entrance pupil of the projection objective. The second field mirror is arranged between the plane with the secondary light sources and the first field mirror.

The second field mirror is preferably an off-axis segment of a rotational symmetric reflective surface, which can be designed aspherical or spherical, or an on-axis segment of a toroidal reflective surface.

The incidence angles of the incoming rays with respect to the surface normals at the points of incidence of the incoming rays on the second field mirror are preferably lower than 25°. Since the mirrors have to be coated with multilayers for the EUV wavelength region, the divergence and the incidence angles of the incoming rays are preferably as low as possible to increase the reflectivity, which should be better than 65%. With the second field mirror being arranged as a normal incidence mirror the beam path is folded and the illumination system can be made more compact.

To reduce the length of the illumination system further the field lens comprises preferably a third field mirror. The third field mirror is preferably arranged between the plane with the secondary light sources and the second field mirror.

The third field mirror has preferably negative optical power and forms together with the second and first field mirror an optical telescope system having a object plane at the secondary light sources and an image plane at the exit pupil of the illumination system to image the secondary light sources into the exit pupil. The pupil plane of the telescope system is arranged at the image plane of the illumination system. Therefore the ray bundles coming from the secondary light sources are superimposed in the pupil plane of the telescope system or in the image plane of the illumination system accordingly. The first field mirror has mainly the function of forming the arc-shaped field, wherein the telescope system is mainly determined by the negative third field mirror and the positive second field mirror.

In another embodiment the third field mirror has preferably positive optical power to generate images of the secondary light sources in a plane between the third and second field mirror, forming tertiary light sources. The tertiary light sources are imaged with the second field mirror and the first field mirror into the exit pupil of the illumination system. The images of the tertiary light sources in the exit pupil of the illumination system are called in this case quaternary light sources.

Since the plane with the tertiary light sources is arranged conjugated to the exit pupil, this plane can be used to arrange masking blades to change the illumination mode or to add transmission filters. This position in the beam path has the advantage to be freely accessible.

The third field mirror is similar to the second field mirror preferably an off-axis segment of a rotational symmetric reflective surface, which can be designed aspherical or spherical, or an on-axis segment of a toroidal reflective surface.

The incidence angles of the incoming rays with respect to the surface normals at the points of incidence of the incoming rays on the third field mirror are preferably lower than 25°. With the third field mirror being arranged as a normal incidence mirror the beam path can be folded again to reduce the overall size of the illumination system.

To avoid vignetting of the beam path the first, second and third field mirrors are preferably arranged in a non-centered system. There is no common axis of symmetry for the mirrors. An optical axis can be defined as a connecting line between the centers of the used areas on the field mirrors, wherein the optical axis is bent at the field mirrors depending on the tilt angles of the field mirrors.

With the tilt angles of the reflective components of the illumination system the beam paths between the components can be bent. Therefore the orientation of the beam cone emitted by the source and the orientation of the image plane system can be arranged according to the requirements of the overall system. A preferable configuration has a source emitting a beam cone in one direction and an image plane having a surface normal which is oriented almost perpendicular to this direction. In one embodiment the source emits horizontally and the image plane has a vertical surface normal. Some light sources like undulator or wiggler sources emit only in the horizontal plane. On the other hand the reticle should be arranged horizontally for gravity reasons. The beam path therefore has to be bent between the light source and the image plane about almost 90°. Since mirrors with incidence angles between 30° and 60° lead to polarization effects and therefore to light losses, the beam bending has to be done only with grazing incidence or normal incidence mirrors. For efficiency reasons the number of mirrors has to be as small as possible.

By definition all rays intersecting the field in the image plane have to go through the exit pupil of the illumination system. The position of the field and the position of the exit pupil are defined by the object field and the entrance pupil of the projection objective. For some projection objectives being centered systems the object field is arranged off-axis of an optical axis, wherein the entrance pupil is arranged on-axis in a finite distance to the object plane. For these projection objectives an angle between a straight line from the center of the object field to the center of the entrance pupil and the surface normal of the object plane can be defined. This angle is in the range of 3° to 10° for EUV projection objectives. Therefore the components of the illumination system have to be configured and arranged in such a way that all rays intersecting the object field of the projection objective are going through the entrance pupil of the projection objective being decentered to the object field. For projection exposure apparatus with a reflective reticle all rays intersecting the reticle needs to have incidence angles greater than 0° to avoid vignetting of the reflected rays at components of the illumination system.

In the EUV wavelength region all components are reflective components, which are arranged preferably in such a way, that all incidence angles on the components are lower than 25° or greater than 65°. Therefore polarization effects arising for incidence angles around an angle of 45° are minimized. Since grazing incidence mirrors have a reflectivity greater than 80%, they are preferable in the optical design in comparison to normal incidence mirrors with a reflectivity greater than 65%.

The illumination system is typically arranged in a mechanical box. By folding the beam path with mirrors the overall size of the box can be reduced. This box preferably does not interfere with the image plane, in which the reticle and the reticle supporting system are arranged. Therefore it is advantageous to arrange and tilt the reflective components in such a way that all components are completely arranged on one side of the reticle. This can be achieved if the field lens comprises only an even number of normal incidence mirrors.

The illumination system as described before can be used preferably in a projection exposure apparatus comprising the illumination system, a reticle arranged in the image plane of the illumination system and a projection objective to image the reticle onto a wafer arranged in the image plane of the projection objective. Both, reticle and waver are arranged on a support unit, which allows the exchange or scan of the reticle or wafer.

The projection objective can be a catadioptric lens, as known from U.S. Pat. No. 5,402,267 for wavelengths in the range between 100 nm and 200 nm. These systems have typically a transmission reticle.

For the EUV wavelength range the projection objectives are preferably all-reflective systems with four to eight mirrors as known for example from U.S. Ser. No. 09/503,640 showing a six mirror projection lens. These systems have typically a reflective reticle.

For systems with a reflective reticle the illumination beam path between the light source and the reticle and the projection beam path between the reticle and the wafer preferably interfere only nearby the reticle, where the incoming and reflected rays for adjacent object points are traveling in the same region. If there are no further crossing of the illumination and projection beam path it is possible to separate the illumination system and the projection objective except for the reticle region.

The projection objective has preferably a projection beam path between said reticle and the first imaging element which is convergent toward the optical axis of the projection objective. Especially for a projection exposure apparatus with a reflective reticle the separation of the illumination system and the projection objective is easier to achieve.

BRIEF DESCRIPTION OF THE DRAWINGS

The invention will be described below on the basis of drawings.

Here:

FIG. 1 shows a schematic view of a embodiment according to the invention comprising a light source 8001, a collector mirror 8003, a plate with the field raster elements 8009, a plate with the pupil raster elements 8015, a field lens 8021, a image plane 8029 and a exit pupil 8035. The field lens 8021 in the embodiment shown comprises a field mirror 8023 with positive optical power, a field mirror 8025 with negative optical power and a field forming mirror 8027.

The arrangement of the second optical component with three field mirrors 8023, 8025 and 8027 including a telescope objective is advantageous since it further reduces the track lenght of the overall system, but not necessary. For example the field lens 8021 could comprise only one normal-incidence mirror with positive optical power for pupil imaging and one grazing-incidence mirror with negative optical power for field shaping. Exemplary for the imaging of all secondary light sources, the imaging of one secondary light source 8007 into the exit pupil 8033 forming a tertiary light source 8035 is shown. The optical axis of the illumination system is not a straight line but is defined by the connection lines between the single components being intersected by the optical axis at the centers of the components. Therefore, the illumination system is a non-centered system having optical axis 8045.1, 8045.2, 8045.3 being bent at each component to get a beam path free of vignetting. There is no common axis of symmetry for the optical components. Projection objectives for EUV exposure apparatus are typically centered systems with a straight optical axis and with an off-axis object field. The optical axis 8047 of the projection objective is shown as a dashed line. The distance between the center of the field 8031 and the optical axis 8047 of the projection objective is equal to the field radius $R_{field}$.

According to the invention a first optical axis 8045.1 is defined between the collector unit 8003 and the first optical element with field raster elements 8009. A second optical axis 8045.2 is defined between the first optical element with field raster elements 8009 and the second optical element with pupil raster element. Between the pupil raster elements 8015 and the field lens 8021 a third optical axis. 8045.3 is defined. The directional vector 8046.1 of the first optical axis 8045.1 and the directional vector 8046.2 of the second optical axis 8045.2 defined a plane, which is e. g. the paper plane of FIG. 1.

According to the invention the first and second optical elements are tilted to cause a crossing of the projection of the third optical axis 8045.3 into the plane defined by the directional vectors 8046.1, 8046.2 and the first optical axis 8045.1.

Figure 1:
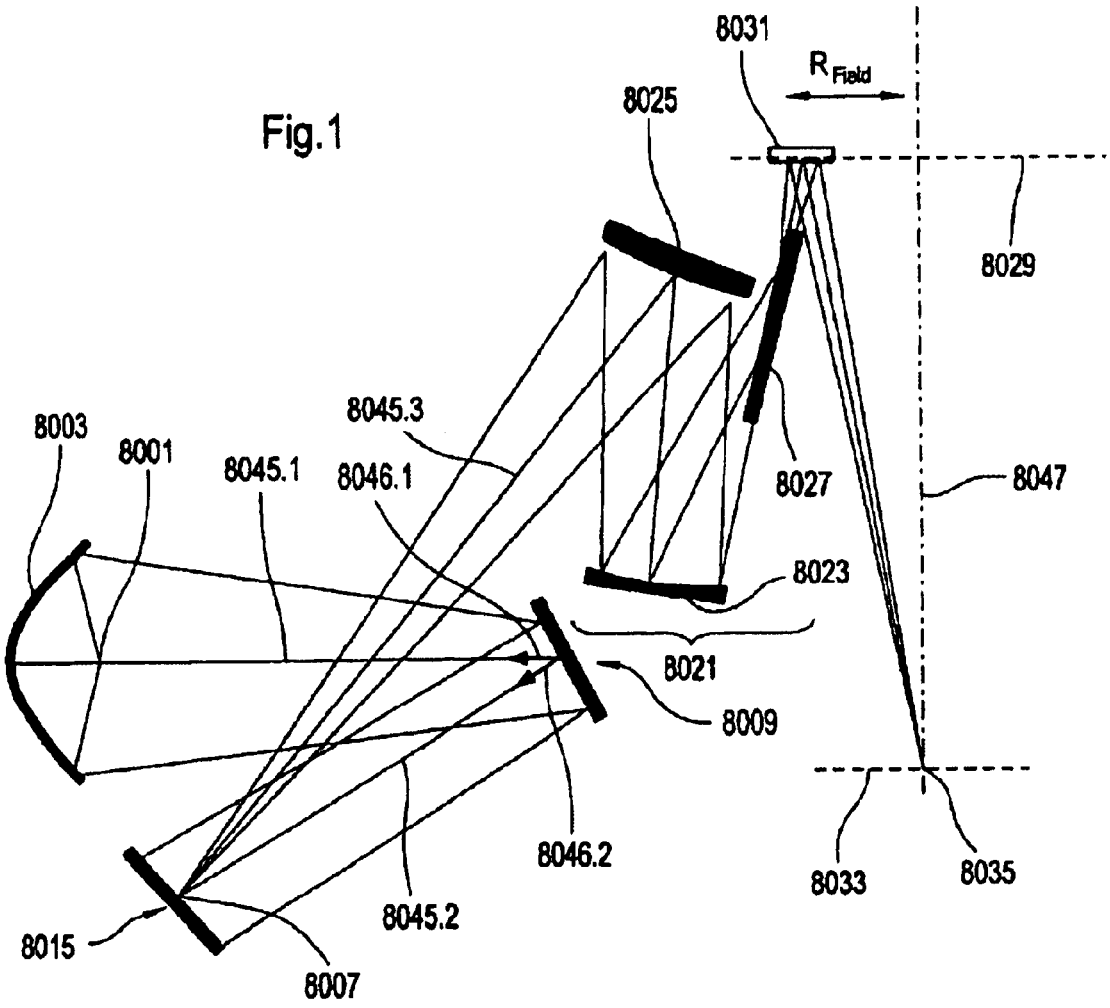
FIG. 1: A schematic view of a reflective embodiment with a crossing of the beam paths.

In case the first, second and third optical axis lie in the same plane e. g. the paper plane of FIG. 1, the beam path between the plate with the pupil raster elements 8015 and the field mirror 8025 is crossing the beam path from the collector mirror 8003 to the plate with the field raster elements 8009. With this arrangement it is possible to have light sources 8001 emitting a beam cone horizontally and to arrange the reticle horizontally in the image plane 8029 simultaneously.

Figure 2:
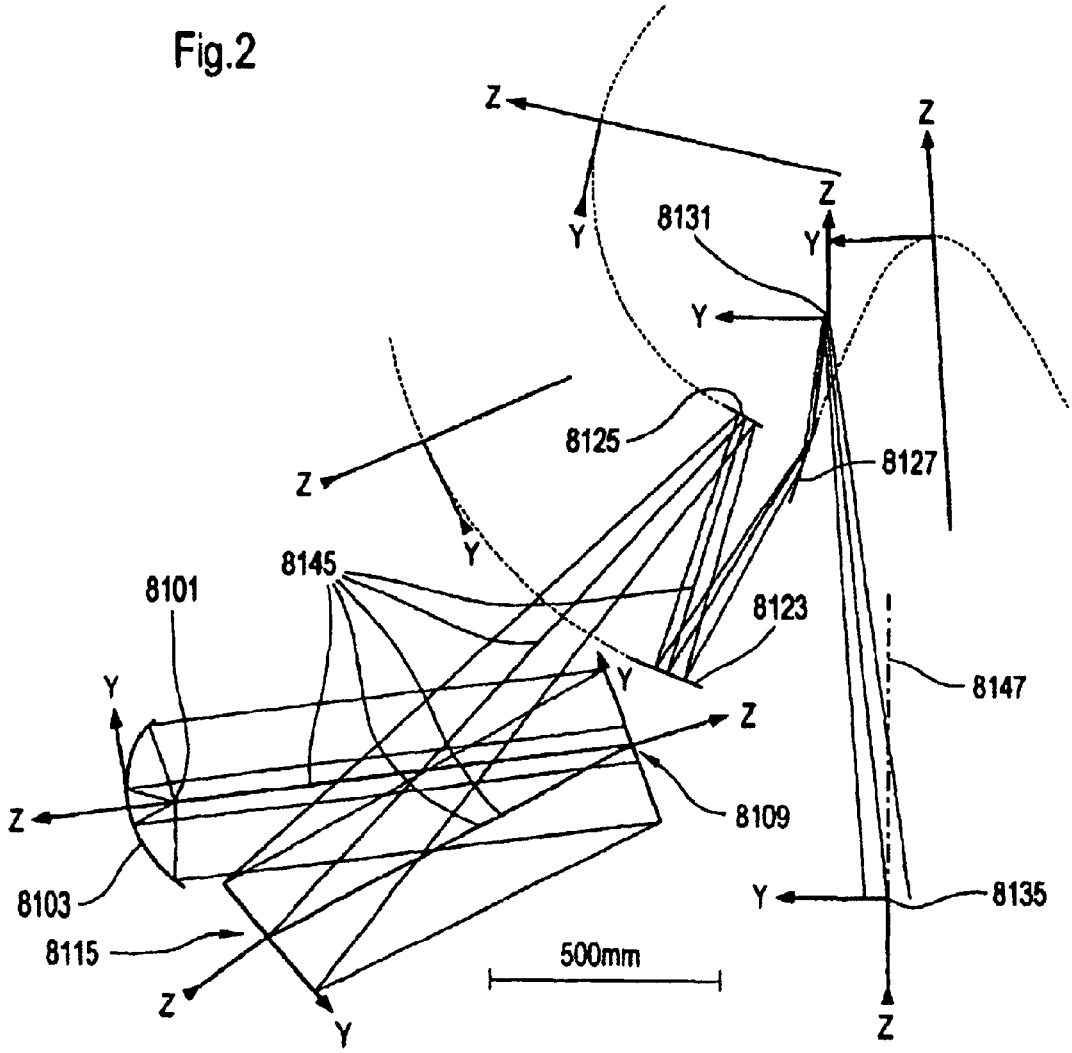
FIG. 2: A detailed view of the embodiment of FIG. 1.

FIG. 2 shows a similar embodiment to the one of FIG. 1 in a detailed view. Corresponding elements have the same reference numbers as those in FIG. 1 increased by 100. Therefore, the description to these elements is found in the description to FIG. 1.

The components are shown in a y-z-sectional view, wherein for each component the local co-ordinate system with the y- and z-axis ist shown. For the collector mirror 8103 and the field mirrors 8123, 8125 and 8127 the local co-ordinate systems are defined at the vertices of the mirrors. For the two plates with the raster elements the local co-ordinate systems are defined at the centers of the plates. In table 1 the arrangement of the local co-ordinate systems with respect to the local co-ordinate systems of the light source 8301 is given. The tilt angles α, β and γ about the x-, y- and z-axis are defined in a right-handed system.

TABLE 1

Co-ordinate systems of vertices of mirrors

| | X [mm] | Y [mm] | Z [mm] | α[°] | β[°] | γ[°] |
|---|---|---|---|---|---|---|
| Light source 8101 | 0.0 | 0.0 | 0.0 | 0.0 | 0.0 | 0.0 |
| Collector mirror 8103 | 0.0 | 0.0 | 100.0 | 0.0 | 0.0 | 0.0 |
| Plate with field raster elements 8109 | 0.0 | 0.0 | −10.0 | 10.5 | 180.0 | 0.0 |
| Plate with pupil raster elements 8115 | 0.0 | −322.5 | −159.8 | 31.0 | 0.0 | 180.0 |
| Field mirror 8125 | 0.0 | 1395.9 | −1110.3 | −20.3 | 0.0 | 180.0 |
| Field mirror 8123 | 0.0 | 746.5 | −645.4 | 13.6 | 0.0 | 180.0 |
| Field mirror 8127 | 0.0 | 1053.2 | −1784.2 | 86.3 | 180.0 | 0.0 |
| Image plane 8131 | 0.0 | 906.0 | −1537.1 | 82.0 | 0.0 | 0.0 |
| Exit pupil 8135 | 0.0 | −413.5 | −1491.0 | 82.0 | 0.0 | 0.0 |

The surface data are given in table 2.

TABLE 2

Optical data of the components

| | Collector mirror 8103 | Field raster element 8109 | Pupil raster element 8115 | Field mirror 8125 | Field mirror 8123 | Field mirror 8127 |
|---|---|---|---|---|---|---|
| R [mm] | −200.00 | −1800.0 | −1279.7 | −588.9 | −957.1 | −65.5 |
| K | −1.0 | 0.0 | 0.0 | −0.0541 | −0.0330 | −1.1186 |
| Focal length f [mm] | — | 900.0 | 639.8 | −317.5 | 486.8 | −757.1 |

The light source 8101 in this embodiment is also a Laser-Produced-Plasma source. The distance to the collector mirror 8103 is set to 100 mm.

The collector mirror 8103 is a parabolic mirror generating a parallel ray bundle, wherein the light source 8101 is arranged in the focal point of the parabola.

Therefore the field raster elements 8109 are concave mirrors to generate the secondary light sources at the corresponding pupil raster elements 8115. The focal length of the field raster elements 8109 is equal to the distance between the field raster elements 8109 and the corresponding pupil raster elements 8115. The distance between the vertex of the collector mirror 8103 and the center of the plate with the field raster elements 8109 is 1100 mm. The field raster elements 8109 are rectangular with a length $X_{FRE}$=46.0 mm and a width $Y_{FRE}$=2.8 mm. The main incident angle of the rays intersecting the field raster elements 8109 is 10.5°, the range of the incidence angles is from 8° up to 13°. Therefore the field raster elements 8109 are used at normal incidence.

The plate with the pupil raster elements 8115 is arranged in the focal plane of the field raster elements 8109. The pupil raster elements 8115 are concave mirrors. The mean incidence angle of the rays intersecting the pupil raster elements 8115 is 10.0°, the range of the incidence angles is from 7° up to 13°. Therefore the pupil raster elements 8115 are used at normal incidence.

Figure 3:
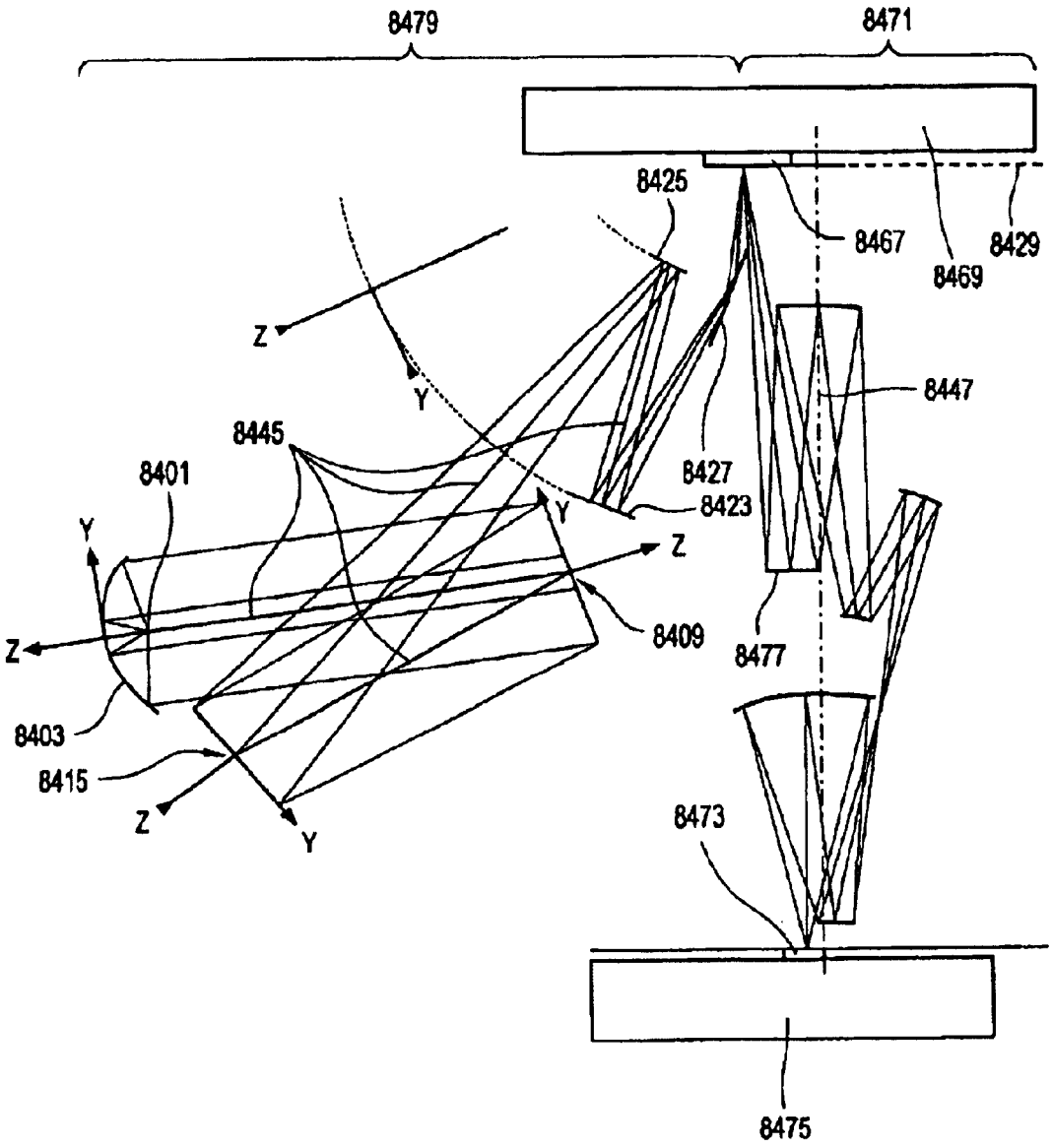
FIG. 3: A detailed view of a projection exposure apparatus.

FIG. 3 shows an EUV projection exposure apparatus in a detailed view. The illumination system is the same as shown in detail in FIG. 2. Corresponding elements have the same reference numbers as those in FIG. 2 increased by 300. Therefore, the description to these elements is found in the description to FIG. 2. In the image plane 8429 of the illumination system the reticle 8467 is arranged. The reticle 8467 is positioned by a support system 8469. The projection objective 8471 having six mirrors images the reticle 8467 onto the wafer 8473 which is also positioned by a support system 8475. The mirrors of the projection objective 8471 are centered on a common straight optical axis 8447. The arc-shaped object field is arranged off-axis. The direction of the beam path between the reticle 8467 and the first mirror 8477 of the projection objective 8471 is tilted to the optical axis 8447 of the projection objective 8471. The angles of the chief rays 8479 with respect to the normal of the reticle 8467 are between 5° and 7°. As shown in FIG. 3 the illumination system 8479 is well separated from the projection objective 8471. The illumination and the projection beam path interfere only nearby the reticle 8467. The beam path of the illumination system is folded with reflection angles lower than 25° or higher than 75°.

What is claimed is:

1. An illumination system, particularly for microlithography with wavelengths≦193 nm, comprising:

a primary light source[(8001, 8101, 8401)];

a first optical component;

a second optical component[(8021, 8121, 8421)];

an image plane[(8029, 8129, 8429)]; and an exit pupil[(8033, 8133)], wherein said first optical component transforms said primary light source[(8001, 8101, 8401)] into a plurality of secondary light sources that are imaged by said second optical component in said exit pupil[(8033, 8133)], wherein said first optical component includes a first [optical-element] *optical element* having a plurality of first raster elements [(8009, 8109, 8409)] that are imaged into said image plane[(8029, . . . )], producing a plurality of images being superimposed, at least partially, on a field in said image plane[(8029, . . . )], wherein said first optical component comprises a collector unit[(8003, 8103, 8403)] and a second optical element having a plurality of second raster elements[(8015, 8115, 8415)], said illumination system further comprising:

a first optical axis[(8045.1)] between said collector unit[(8003, . . . )] and said first optical element, wherein said first optical element is reflective;

a second optical axis[(8045.2)] between said first optical element and said second optical element, wherein said second optical element is reflective; and a third optical axis[(8045.3)] between said second optical element and said second optical component[(8021, 8121, 8421)], wherein [the] *a* directional vector[(8046.1)] of the first optical axis[(8045.1)] and [the] *a* directional vector [(8046.2)] of the second optical axis [(8046.2)] define a plane and wherein said first and second optical elements are tilted to cause a crossing [or] *of* the projection of said third optical axis [(8045.3)] into said plane and said first optical axis[, second optical element, wherein said second optical element is reflective; and a third optical axis (8045.3) between said second optical element and said second optical component (8021, 8121, 8421), wherein the directional vector (8046.1) of the first optical axis (8045.1) and the directional vector (8046.2) of the second optical axis (8045.2) define a plane and wherein said first and second optical elements are tilted to cause a crossing of the projection of said third optical axis (8045.3) into said plane and said first optical axis].

2. The illumination system according to claim 1, further comprising:

a first beam path along said first optical axis[)];

a second beam path along said second optical axis[)]; and a third beam path along said third optical axis, wherein said first and said second optical elements are tilted to cause a crossing of said third beam path and said first beam path.

3. The illumination system according to claim 1, wherein said primary light source produces a beam cone oriented in a first direction, wherein said image plane has a surface normal that is substantially perpendicular to said first direction, wherein said first optical component comprises at least one first mirror, and wherein said second optical component comprises at least one second mirror, said illumination system having a beam path between said primary light source and said image plane that is bent with said at least one first mirror and said at least one second mirror.

4. The illumination system according to claim 1, further comprising:

a straight line from a center of said field in said image plane to a center of said exit pupil; and an angle between said straight line and a surface normal of said image plane, wherein said angle is between 3° and 10°.

5. The illumination system according to claim 1, wherein each of a plurality of rays intersects said first and second optical components with incidence angles of greater than 65° or less than 25°.

6. The illumination system according to claim 1, wherein said second optical component comprises an even number of normal incidence mirrors having incidence angles of [loss] *less* than 25°.

7. The illumination system according to claim 1, wherein said plurality of first raster elements deflect a plurality of incoming ray bundles to produce a plurality of deflected ray bundles with first deflection angles, and wherein at least two of said first deflection angles are different form one another.

8. The illumination system according to claim 1, wherein each of said plurality of first raster elements corresponds to one of said plurality of second raster elements, wherein each of said plurality of first raster elements deflects one of said plurality of incoming ray bundles to said corresponding one of said plurality of second raster elements, and wherein said plurality of second raster elements and said second optical component image said corresponding first raster elements into said image plane.

9. The illumination system according to claim 8, wherein said plurality of second raster elements are concave mirrors.

10. The illumination system according to claim 1, wherein said field is a segment of an annulus, wherein said plurality of first raster elements are rectangular, and wherein said second optical component comprises a first field mirror for shaping said field to said segment of said annulus.

11. The illumination system according to claim 10, wherein said first field mirror has negative optical power, and wherein said second optical component comprises a second field mirror with positive optical power.

12. The illumination system according to claim 10, wherein said second optical component comprises a third field mirror, and wherein said third field mirror has negative optical power.

13. The illumination system according to claim 12, wherein said third field mirror[.] has positive optical power.

14. A projection exposure apparatus for microlithography comprising:

the illumination system of claim 1;

a reticle being located at said image plane;

a light-sensitive object on a support system; and a projection objective to image said reticle onto said light-sensitive object.

15. The projection exposure apparatus of claim 14, further comprising:

an illumination beam path between said primary light source and said reticle that passes through said first optical component and said second optical component; and a projection beam path between said reticle and said light-sensitive object that passes through said projection objective, wherein said illumination beam path and said projection beam path do not cross.

16. The projection exposure apparatus of claim 14, further comprising:

a projection beam path between said reticle and a first imaging element of said projection objective, wherein said reticle is reflective, and wherein said projection beam path is tilted towards an optical axis of said projection objective.

* * * * *